(12) United States Patent
Cho et al.

(10) Patent No.: US 9,871,085 B2
(45) Date of Patent: Jan. 16, 2018

(54) ORGANIC LIGHT-EMITTING DIODE DISPLAY PANEL

(71) Applicant: LG Display Co., Ltd., Seoul (KR)

(72) Inventors: Se-Jun Cho, Goyang-si (KR);
Joung-Woo Lee, Seoul (KR);
Seung-Hee Kuk, Paju-si (KR);
Mi-Seong Kim, Bucheon-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/395,522

(22) Filed: Dec. 30, 2016

(65) Prior Publication Data
US 2017/0194399 A1    Jul. 6, 2017

(30) Foreign Application Priority Data
Dec. 31, 2015  (KR) .................. 10-2015-0191573

(51) Int. Cl.
*H01L 27/32* (2006.01)
*H01L 51/52* (2006.01)

(52) U.S. Cl.
CPC ...... *H01L 27/3246* (2013.01); *H01L 27/3248* (2013.01); *H01L 27/3258* (2013.01); *H01L 27/3276* (2013.01); *H01L 51/5203* (2013.01)

(58) Field of Classification Search
CPC ............. H01L 27/3246; H01L 27/3258; H01L 27/3248; H01L 27/3276
See application file for complete search history.

(56) References Cited

U.S. PATENT DOCUMENTS

| | | | |
|---|---|---|---|
| 2009/0115318 A1* | 5/2009 | Gregory | H01L 27/3246 313/504 |
| 2012/0104405 A1* | 5/2012 | Choi | H01L 27/124 257/72 |
| 2013/0009154 A1* | 1/2013 | Choi | H01L 27/124 257/59 |
| 2013/0214301 A1* | 8/2013 | Yamada | H01L 33/08 257/88 |
| 2015/0340412 A1* | 11/2015 | Lee | H01L 51/56 257/88 |
| 2017/0194398 A1* | 7/2017 | Kim | H01L 27/3246 |

* cited by examiner

*Primary Examiner* — Douglas Menz
(74) *Attorney, Agent, or Firm* — Dentons US LLP (57) ABSTRACT

Disclosed is an organic light-emitting diode display panel, which may effectively reduce or prevent spreading of the peeling of an organic light-emitting layer by using a bar-shaped reversed spacer, regardless of the direction in which the organic layer peels off. The organic light-emitting diode display panel may include a reversed spacer, which is disposed on a bank insulation layer having an opening and includes a reversed-trapezoidal cross section, the reversed spacer having a bar shape when viewed from the front side of the organic light-emitting diode display panel.

11 Claims, 7 Drawing Sheets

Fig. 1

Related art

ORGANIC LIGHT-EMITTING DIODE DISPLAY PANEL

This application claims the benefit of Korean Patent Application No. 10-2015-0191573, filed on 31 Dec. 2015, which is hereby incorporated by reference as if fully set forth herein.

BACKGROUND OF THE INVENTION

Field of the Invention

The present invention relates to an organic light-emitting diode display and a method of manufacturing the same, and more particularly, to an organic light-emitting diode display panel, which can reduce or prevent peeling of an organic light-emitting layer by using a reversed spacer.

Discussion of the Related Art

An image display device, which realizes various kinds of information through a screen, is a core technology in information communication, and is being developed to be thinner, lighter, and more portable, with higher performance As a flat-panel display device, which is capable of reducing the weight and volume of a cathode ray tube (CRT), an organic light-emitting diode (OLED) display device, which displays an image by controlling the amount of luminescence of an organic light-emitting layer, is in the spotlight. Such an OLED display device is a self-emissive device using a thin light-emitting layer between electrodes, and has an advantage of slim profile.

In an active matrix OLED (AMOLED) display device, pixels each typically including sub-pixels of three colors (red, green, and blue) are arranged in a matrix to display an image. Each sub-pixel includes an organic electroluminescent (OEL) cell, and a cell-driving unit for independently driving the OEL cell.

The OEL cell typically includes a first electrode connected to the cell-driving unit, a bank insulation layer having an opening for exposing the first electrode, an organic layer including a light-emitting layer disposed on the top of the first electrode, and a second electrode formed over the organic layer. At this time, a spacer is provided on the top of the bank insulation layer.

To drive the OEL cell, the cell-driving unit typically includes a gate line for supplying a scan signal, a data line for supplying a video data signal, a common power line for supplying a common power signal, and at least two thin-film transistors and a storage capacitor provided between these lines to connect the two thin-film transistors.

Recently, various types of foldable display devices using OLEDs have been proposed. However, in the case of a conventional OLED display device, the organic layer including the light-emitting layer may peel off near a folding area due to a low adhesive force of the organic layer.

In order to address the aforementioned problem, the applicant has disclosed an OLED device including a reversed spacer having a reverse trapezoidal shape.

A foldable OLED device having a dot-shaped reversed spacer may show variation in ability to reduce or prevent peeling of the organic layer depending on the direction in which the peeling of the organic layer begins. Thus, the foldable OLED device having the dot-shaped reversed spacer may have limitations in reducing or preventing peeling of the organic layer when the device is folded in a particular direction.

SUMMARY

Accordingly, the present invention is directed to an organic light-emitting diode display and a method of manufacturing the same that substantially obviate one or more problems due to limitations and disadvantages of the related art.

An advantage of the present invention is to provide an organic light-emitting diode display panel, which may effectively reduce or prevent spreading of peeling of an organic layer by changing the shape of a reversed spacer.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light-emitting diode display panel includes a reversed spacer, which is disposed on a bank insulation layer having openings and includes a reversed-trapezoidal vertical cross-section, the reversed spacer having a bar shape when viewed from a direction perpendicular to the substrate.

The openings are located in a diamond shape to define respective sub-pixels, and the openings, which are adjacent to each other in a vertical direction, are shifted from each other by a width of each opening. Each reversed spacer is located between the adjacent openings.

A plurality of reversed spacers may include discontinuous areas, which are formed in bent portions at a constant interval so as to form a zigzag shape. Different reversed spacers may be alternately arranged in a first diagonal direction and a second diagonal direction. At an intersection at which the two different reversed spacers cross each other, one of the two reversed spacers may be discontinuously formed.

A reversed spacer having a dot shape may be further provided in each of the discontinuous areas of the reversed spacers having a zigzag shape.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE ILLUSTRATED EMBODIMENTS

Hereinafter, embodiments of the present invention will be described in detail with reference to the accompanying drawings.

Figure 1:
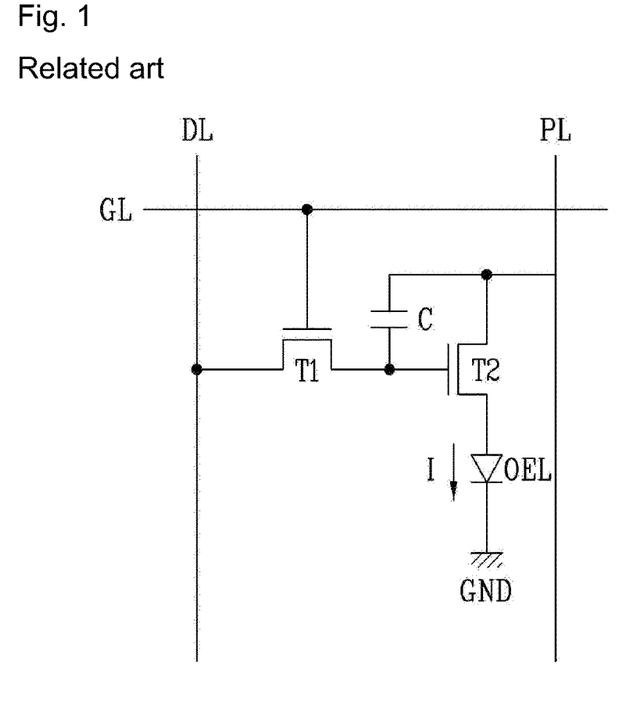
FIG. 1 is an equivalent circuit diagram illustrating one pixel of a light-emitting diode display panel according to an embodiment of the present invention.

FIG. 1 is an equivalent circuit diagram illustrating one pixel of a light-emitting diode display panel according to an embodiment of the present invention.

The pixel of the light-emitting diode display panel illustrated in FIG. 1 includes a switch thin-film transistor T1 connected to a gate line GL and a data line DL, a driving thin-film transistor T2 connected to the switch thin-film transistor T1, to a power line PL, and to an OEL cell, a storage capacitor C provided between the power line PL and a drain electrode of the switch thin-film transistor T1 to connect them to each other, and the OEL cell connected to the driving thin-film transistor T2.

In the switch thin-film transistor T1, a gate electrode thereof is connected to the gate line GL, a source electrode thereof is connected to the data line DL, and the drain electrode thereof is connected to a gate electrode of the driving thin-film transistor T2 and the storage capacitor C. In the driving thin-film transistor T2, a drain electrode thereof is connected to the power line PL, and a source electrode thereof is connected to any one electrode of the OEL cell. The storage capacitor C is provided between the power line PL and the gate electrode of the driving thin-film transistor T2 to connect the two to each other.

The switch thin-film transistor T1 is turned on when a scan pulse is supplied to the gate line GL, thereby supplying a data signal supplied to the data line DL to the storage capacitor C and the gate electrode of the driving thin-film transistor T2. The driving thin-film transistor T2 controls the current I to be supplied from the power line PL to the OEL cell in response to the data signal supplied to the gate electrode thereof, thereby adjusting the amount of luminescence of the OEL cell. In addition, even if the switch thin-film transistor T1 is turned off, the driving thin-film transistor T2 maintains the luminescence of the OEL cell using the voltage charged in the storage capacitor C by supplying constant current I until a data signal of a next frame is supplied thereto.

Figure 2:
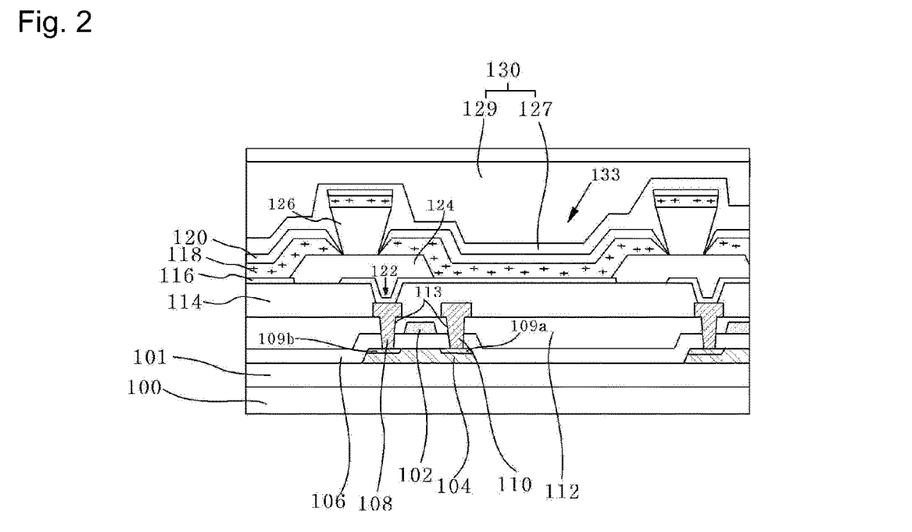
FIG. 2 is a cross-sectional view for explaining a structure of a light-emitting diode display panel, which is provided with a reversed spacer.

FIG. 2 is a cross-sectional view for explaining the structure of the light-emitting diode display panel, which is provided with a reversed spacer.

The driving thin-film transistor T2, as illustrated in FIG. 2, includes a semiconductor layer 104, which is formed over a substrate 100 and a buffer layer 101 and includes a source area 109b and a drain area 109a formed on opposite sides thereof, a gate insulation layer 106, which is configured to cover the semiconductor layer 104, a gate electrode 102, which is disposed on the top of the gate insulation layer 106 so as to correspond to the semiconductor layer 104, a first protective layer 112, which covers the substrate 100 including the gate electrode 102 and includes contact holes 113 for exposing the source and drain areas 109a and 109b disposed on opposite sides of the semiconductor layer 104, and a source electrode 108 and a drain electrode 110, which are connected to the source and drain areas 109b and 109a through the contact holes 113.

The OEL cell includes a first electrode 116 formed on the first protective layer 112 and a second protective layer 114 for covering the driving thin-film transistor T2, a bank insulation layer 124 having an opening 133 for exposing the first electrode 116, a reversed spacer 126 disposed on the bank insulation layer 124, an organic layer 118 including a light-emitting layer formed over the first electrode 116, which is exposed through the opening 133, and a second electrode 120 formed over the organic layer 118.

The first protective film 112 includes a contact hole 122 for exposing the source electrode 108, and the first electrode 116 is connected to the source electrode 108 of the driving thin-film transistor T2 through the contact hole 122.

The substrate 100 may be a flexible glass or polymer substrate, and the light-emitting diode display panel according to an embodiment of the present invention may be manufactured as a flexible display or a foldable display. In this case, the light-emitting diode display panel may include at least one folding area in a display area, and the entire display area may be flexible.

The organic layer 118 is divided into an electron injection layer (EIL), an electron transport layer (ETL), a light-emitting layer 206, a hole transport layer (HTL), and a hole injection layer (HIL). In the light-emitting layer 206, excitons, generated via recombination of electrons from an anode and holes from a cathode, return to a ground state to emit light having a particular wavelength.

When the first electrode 116 is the anode, the second electrode 120 is the cathode. When the first electrode 116 is the cathode, the second electrode 120 is the anode.

A vertical taken cross section of the reversed spacer 126 has a reversed trapezoidal shape. In addition, the organic layer 118 and the second electrode 120 are disposed on the top of the reversed spacer 126.

A barrier layer 130 is disposed on the second electrode 120. The barrier layer 130 has a structure in which at least one inorganic layer 127 and at least one organic layer 129 are alternately stacked one above another.

The organic layer 118 formed on the bank insulation layer 124 is not formed at the position at which the reversed spacer 126 and the bank insulation layer 124 come into contact with each other, and is also not formed on the side surface of the reversed spacer 126. Thus, the organic layer 118, which is formed on the top of the reversed spacer 126, and the organic layer 118, which is formed in the opening 133 and on the bank insulation layer 124, are separated from each other at the position at which the reversed spacer 126 and the bank insulation layer 124 come into contact with each other.

In the case where the reversed spacer 126 is formed on the bank insulation layer 124 as described above, because the organic layer 118 is not deposited at the position at which the reversed spacer 126 and the bank insulation layer 124 come into contact with each other and on the side surface of the reversed spacer 126, the continuity of the organic layer 118 is broken in places. The barrier layer 130 is formed even in the area in which the continuity of the organic layer 118 is broken. The barrier layer 130 is attached to the position at which the reversed spacer 126 and the bank insulation layer 124 come into contact with each other and on the side surface of the reversed spacer 126 with excellent adhesive force, thus having the effect of fixing the organic layer 118. Therefore, when the peeling of the organic layer 118 proceeds to the reversed spacer 126, the peeling stops spreading.

Accordingly, the light-emitting diode display panel according to an embodiment of the present invention may achieve enhanced adhesive force of the organic layer 118, and in particular, may prevent peeling of the organic layer 118 in a folding area when it is embodied in a foldable panel.

The reversed spacer 126 according to an embodiment of the present invention has a bar shape when viewed from the front side, a direction perpendicular to the substrate. Hereinafter, the bar-shaped reversed spacer will be described.

Figure 3:
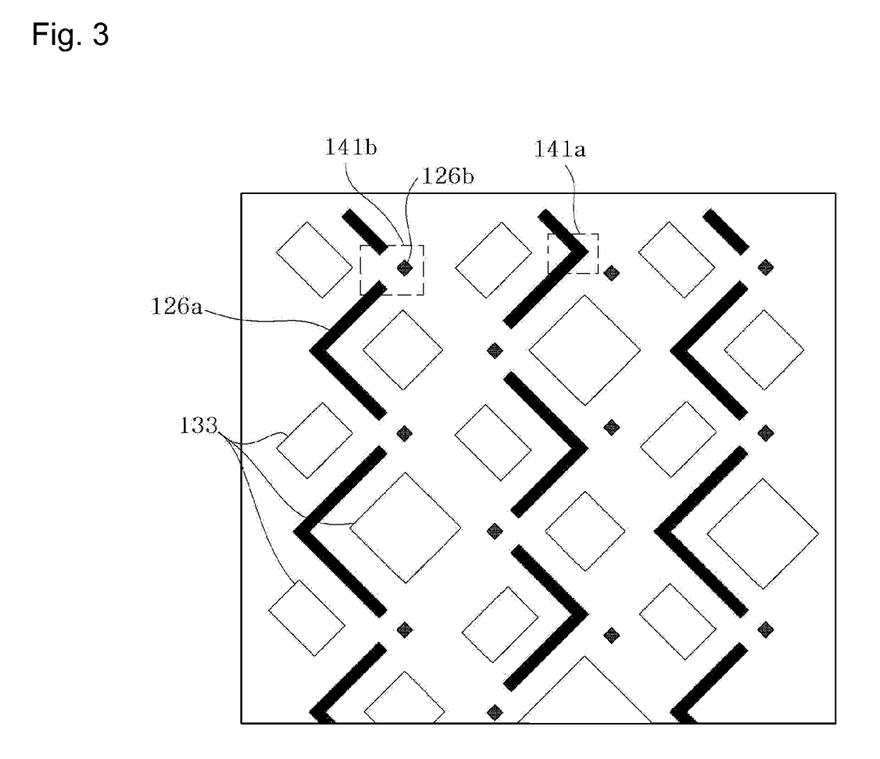
FIG. 3 is a front view illustrating an organic light-emitting diode display panel including a reversed spacer in the form of a line according to the first embodiment of the present invention.

FIG. 3 is a front view illustrating an organic light-emitting diode display panel including a bar-shaped reversed spacer according to the first embodiment of the present invention.

As mentioned above, in the organic light-emitting diode display panel according to an embodiment of the present invention, the openings 133, formed in the bank insulation layer 124, are provided with the organic layer 118 and the second electrode 120 so as to form a light-emitting area of a sub-pixel.

Each of the openings 133 takes the form of a diamond obtained by tilting a rectangle at about 45 degrees relative to the vertical direction, and is oriented diagonally. That is, two openings 133, which are adjacent to each other in the vertical direction, are shifted from each other by the width of the opening 133. The organic light-emitting diode display panel having the structure including the diamond-shaped openings 133 is advantageous in realizing a high-resolution display.

As illustrated in FIG. 3, the sizes of the respective openings 133 may be set differently depending on the color that each opening 133 displays, or may be the same.

The organic light-emitting diode display panel according to the first embodiment of the present invention includes a plurality of first reversed spacers 126a having a bar shape, which is arranged in the vertical direction and is arranged between the diamond-shaped openings 133 in the horizontal direction so as to form a zigzag shape when viewed from the front side. As mentioned above, the vertical cross section of the first reversed spacer 126a has a reversed-trapezoidal shape.

Each of the first reversed spacers 126a having a zigzag shape includes at least one bent portion. As such, the bent portions of a first reversed spacer 126a arranged in the vertical direction include continuous areas 141a, at which a first reversed spacer 126a is continuously arranged, and discontinuous areas 141b, at which a first reversed spacer 126a is cut, are alternately arranged. Although the present embodiment illustrates the case where the continuous areas 141a and the discontinuous areas 141b are located in the bent portions, the continuous areas 141a and the discontinuous areas 141b need not be located in the bent portions.

Assuming that adjacent discontinuous areas 141b are arranged on the same line in a given direction, when the organic layer 118 begins to peel off in the same direction as the direction in which the discontinuous areas 141b are arranged, the organic light-emitting diode display panel may have reduced ability to prevent the peeling of the organic layer 118. Thus, the adjacent discontinuous areas 141b are preferably not arranged on the same line in a given direction.

For example, as illustrated in FIG. 3, the discontinuous areas 141b may not be successively arranged on the same line in the horizontal direction. In FIG. 3, each discontinuous area 141b is shifted in the vertical direction from the discontinuous area of another first reversed spacer, which is adjacent thereto in the horizontal direction.

The discontinuous area 141b functions as a current path of the second electrode 120 formed on the surface of the substrate 100. This will be described below in detail.

In the case where the first reversed spacer 126a includes no discontinuous area 141b and extends from one edge to the other edge of the organic light-emitting diode display panel, the second electrode 120 in the organic light-emitting diode display panel is disconnected. Therefore, each first reversed spacer 126a includes the discontinuous area 141b, and the connection of the second electrode 120 is realized through the discontinuous area 141b to form a current path.

Meanwhile, the organic light-emitting diode display panel according to the first embodiment of the present invention may further include a second reversed spacer 126b, which is formed in a portion of the discontinuous area 141b that is located in the bent portion. The second reversed spacer 126b has a reversed-trapezoidal vertical cross-sectional shape and takes the form of a dot when viewed from the front side.

The second reversed spacer 126b is formed in a portion of the discontinuous area 141b, for example, at the position at which the first reversed spacer 126a is bent. Thus, because no reversed spacer remains in the remaining discontinuous area excluding the area in which the second reversed spacer 126b is formed, a current path for the second electrode 120 is formed. Besides, the second reversed spacer 126b prevents the peeling of the organic layer 118, which may occur in the discontinuous area 141b.

The light-emitting diode display panel including the reversed spacer according to the first embodiment of the present invention prevents the spreading of the peeling of the organic layer 118 because the first or second reversed spacer 126a or 126b is located in the direction in which the peeling of the organic layer 118 occurs.

In addition, because the first reversed spacer 126 is formed in a zigzag shape, regardless of the direction of peeling of the organic layer 118, the peeling stops when it reaches the first reversed spacer.

In this way, the organic light-emitting diode display panel including the reversed spacer according to the first embodiment of the present invention prevents spreading of the peeling of the organic layer 118 in all directions regardless of the direction in which the peeling of the organic layer 118 occurs.

Figure 4:
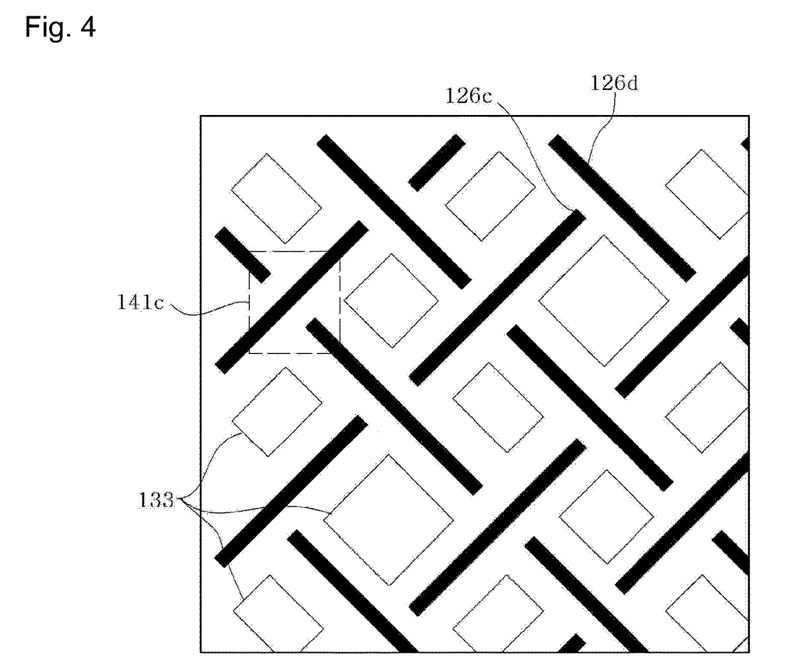
FIG. 4 is a front view for explaining a light-emitting diode display panel including a reversed spacer according to the second embodiment of the present invention.

FIG. 4 is a front view for explaining a light-emitting diode display panel including a reversed spacer according to the second embodiment of the present invention.

The light-emitting diode display panel according to the second embodiment of the present invention includes a plurality of bar-shaped third reversed spacers 126c, of which the major axis is oriented in a first diagonal direction, and a plurality of bar-shaped fourth reversed spacers 126d, of which the major axis is oriented in a second diagonal direction so as to cross the major axis of the third reversed spacers 126c.

Because the current path of the second electrode 120 may need to be formed at the intersection at which the third reversed spacer 126c and the fourth reversed spacer 126d cross each other, a discontinuous area 141c is provided at each intersection. In the discontinuous area 141c, only one of the third reversed spacer 126c and the fourth reversed spacer 126d may be discontinuously formed, and the other reversed spacer may be continuously formed. When one of the third reversed spacer 126c and the fourth reversed spacer 126d is discontinuously formed, the effect of fixing the organic layer 118 and preventing the peeling of the organic layer 118 may be maximized, but there is no problem in forming the current path of the second electrode 120 through the discontinuous area.

In this case, in the respective neighboring discontinuous areas 141c, alternately varying reversed spacers are discontinuously formed.

For example, when the third reversed spacer 126c is discontinuously formed in any one discontinuous area 141c, the fourth reversed spacer 126d is discontinuously formed in another adjacent discontinuous area 141c.

In addition, when the fourth reversed spacer 126d is discontinuously formed in any one discontinuous area 141c, the third reversed spacer 126c is discontinuously formed in another adjacent discontinuous area 141c.

In the case where the different reversed spacers 126c and 126d are discontinuously formed in the adjacent discontinuous areas, as described above, regardless of the direction in which the peeling of the organic layer 118 occurs, the peeling is interrupted by the reversed spacer 126c or 126d, and thus the spreading of the peeling of the organic layer 118 may be prevented in all directions.

FIGS. 5A to 5I are views for explaining a method of forming a light-emitting diode display panel according to an embodiment of the present invention.

Figure 5A:
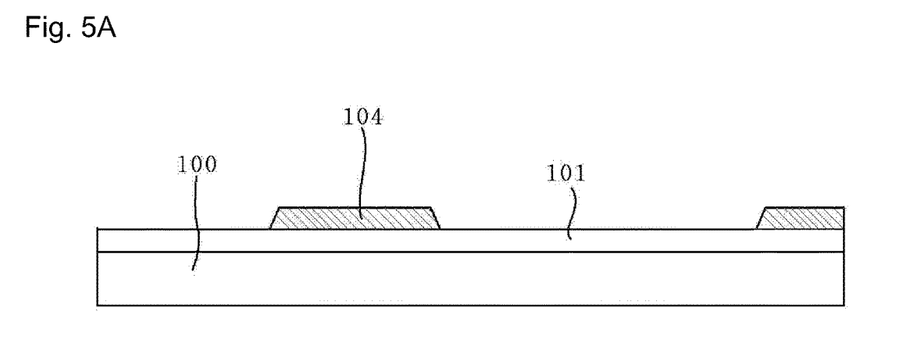
FIGS. 5A to 5I are views for explaining a method of forming a light-emitting diode display panel according to an embodiment of the present invention.

Referring to FIG. 5A, the buffer layer 101 is formed on the substrate 100, and the semiconductor layer 104 is formed on the buffer layer 101. The buffer layer 101 and the semiconductor layer 104 are formed via a deposition method, such as, for example, plasma evaporation chemical vapor deposition (PECVD). Then, the semiconductor layer 104 is patterned through a photolithography process and an etching process.

Figure 5B:
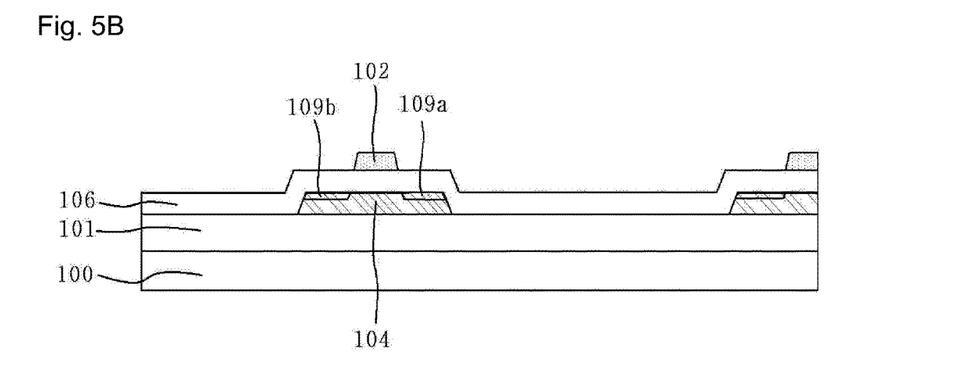

Referring to FIG. 5B, an inorganic insulation material is deposited on the substrate 100 including the semiconductor layer 104 via a deposition method, such as, for example, PECVD to form the gate insulation layer 106. A metal layer is deposited on the gate insulation layer 106 via, for example, sputtering, and is patterned through a photolithography process and an etching process to form the gate electrode 102.

The drain and source areas 109a and 109b are formed by injecting a foreign substance into opposite sides of the semiconductor layer 104 via, for example, ion implantation using the gate electrode 102 as a mask.

Figure 5C:
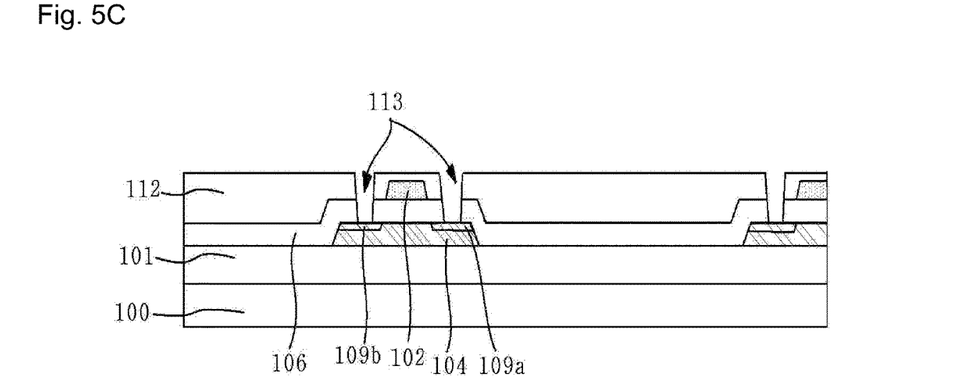

Referring to FIG. 5C, the first protective layer 112 is formed on the substrate 100 including the gate electrode 102 and the semiconductor layer 104 via a deposition method, such as, for example, PECVD. The contact holes 113 are formed in the first protective layer through a photolithography process and an etching process so as to expose the drain and source areas 109a and 109b.

Figure 5D:
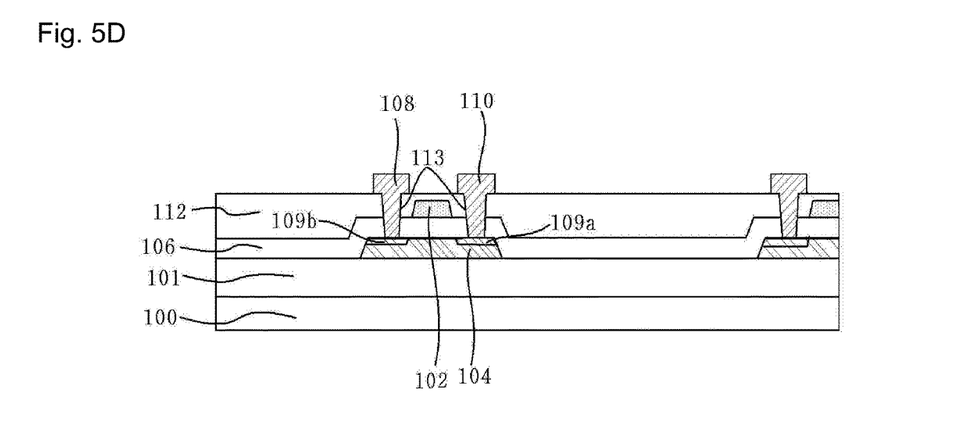

Referring to FIG. 5D, a metal layer for forming the drain electrode 110 and the source electrode 108 is deposited via, for example, sputtering. The source/drain metal layer may be formed of, for example, molybdenum (Mo), molybdenum tungsten (MoW) or copper (Cu). When the source/drain metal layer is patterned through a photolithography process and an etching process, a source/drain electrode pattern including the source electrode 108 and the drain electrode 110 is formed.

Figure 5E:
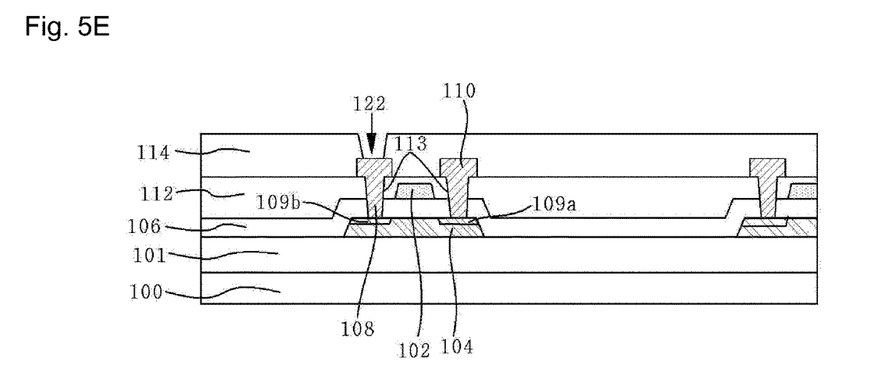

Referring to FIG. 5E, the second protective later 114 including the contact hole 122 is deposited on the first protective layer 112 including the source electrode 108 and the drain electrode 110. At this time, the second protective layer 114 may be formed using an organic insulation material, such as, for example, acryl via, for example, spin coating or spinless coating. Then, the contact hole 122 is formed in the second protective layer 114 through a photolithography process and an etching process to expose the drain electrode 108.

Figure 5F:
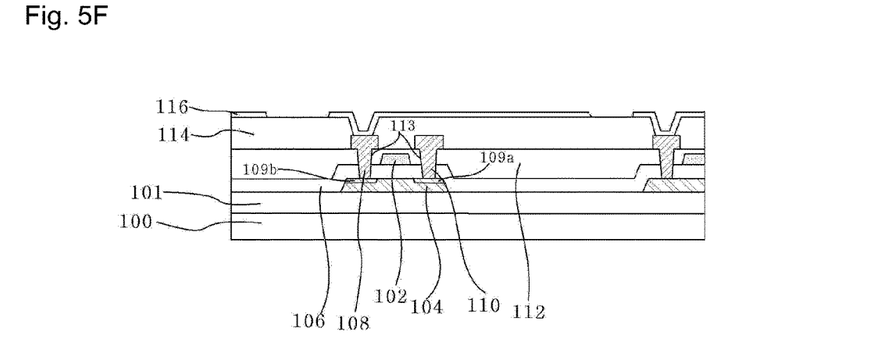

Referring to FIG. 5F, the first electrode 116 is formed on the second protective layer 114.

Specifically, the first electrode 116 may be formed on the second protective layer 114 using an opaque conductive material, such as aluminum (Al), or a transparent conductive material, such as indium tin oxide (ITO), via a deposition method, such as, for example, sputtering. The first electrode 116 is connected to the source electrode 108 of the thin-film transistor through the contact hole 122.

Figure 5G:
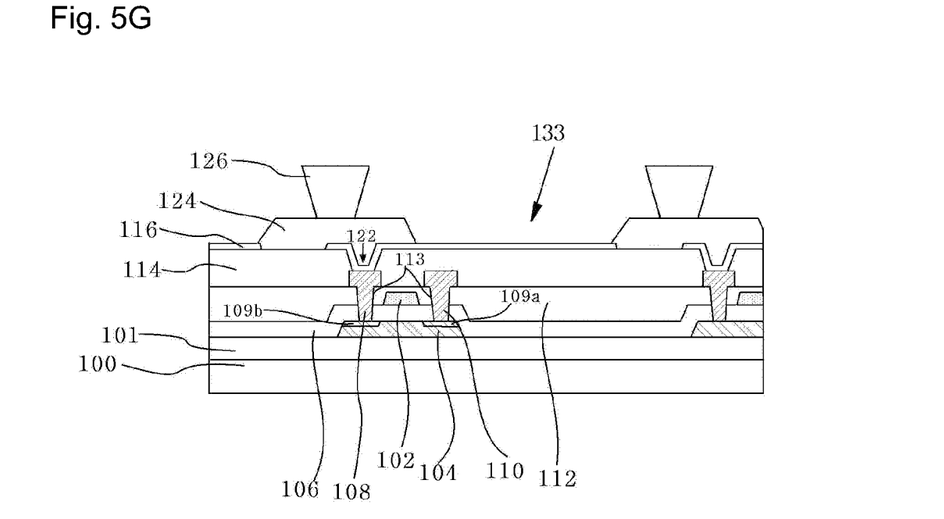

Referring to FIG. 5G, the bank insulation layer 124 including the opening 133 is formed on the substrate 100 including the first electrode 116.

Specifically, the bank insulation layer 124 is formed by applying a photosensitive organic insulation material on the entire surface of the substrate 100 including the first electrode 116 via, for example, spin coating or spinless coating. When the bank insulation layer 124 is patterned through a photolithography process and an etching process, the opening 133 is formed so as to expose the first electrode 116.

In the same manner as the bank insulation layer 124, a photosensitive organic insulation material is formed on the bank insulation layer 124 and the opening 133, by applying a photosensitive organic insulation material to the entire surface of the bank insulation layer 124 via, for example, spin coating or spinless coating. When the organic insulation layer is patterned through a photolithography process and an etching process, the reversed spacer 126 is formed.

The reversed spacer has a bar shape when the organic light-emitting diode display panel is viewed from the front side as described above, and is formed in the shape described in the first or second embodiment of the present invention. Thus, the reversed spacer 126 may include first to fourth reversed spacers 126a, 126b, 126c and 126d.

At this time, by sequentially performing a free-baking process, a photolithography patterning process, a hard baking process, and an etching process on the organic insulation layer to form the reversed spacer 126, the degree of tapering of the reversed spacer 126 may be adjusted so that the reversed spacer 126 has a reversed-trapezoidal shape.

Figure 5H:
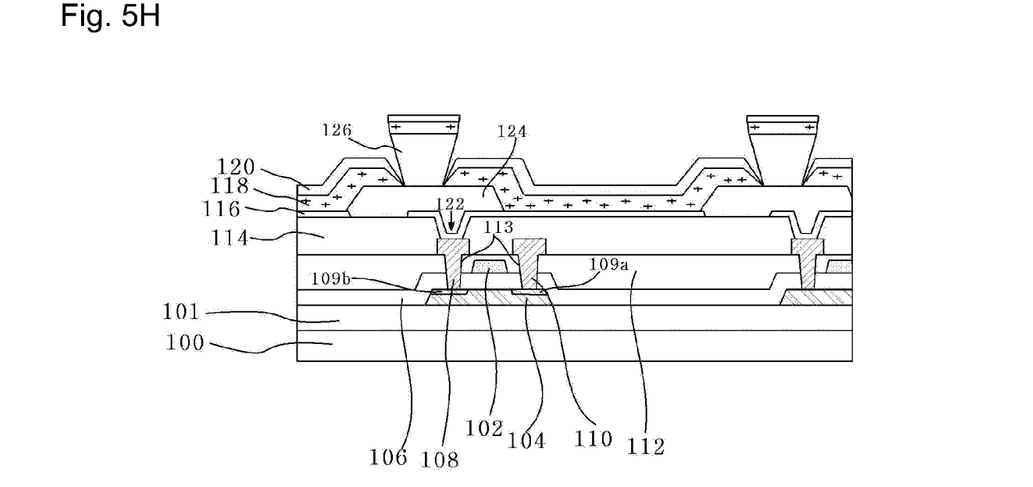

Referring to FIG. 5H, the organic layer 126 and the second electrode 120 are sequentially formed on the substrate 100 including the bank insulation layer 124 provided with the opening 133.

Specifically, the organic layer 118, which includes the electron injection layer (EIL), the electron transport layer (ETL), the light-emitting layer, the hole transport layer (HTL), and the hole injection layer (HIL), is formed on the first electrode 116 via thermal deposition, sputtering, or a combination thereof.

Thereafter, the second electrode 120 is formed on the substrate 100 including the organic layer 118.

The second electrode 120 may be formed in a structure including at least one layer using a transparent conductive material or a metal material via the same method as that of the organic layer 118, or may be formed in a structure including multiple layers using a transparent conductive material or a metal material.

Figure 5I:
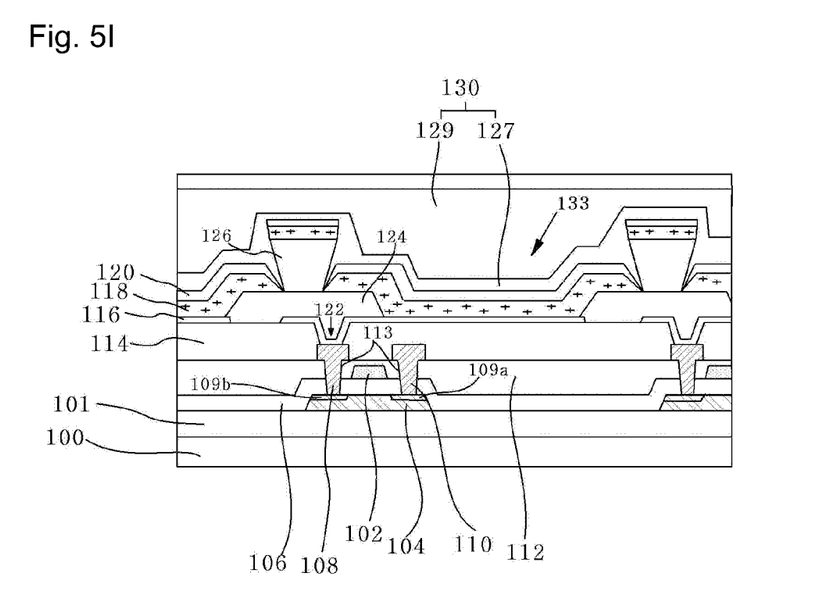

Referring to FIG. 5I, the barrier layer 130 is formed on the top of the second electrode 120. The barrier layer 130 may have a structure in which at least one inorganic layer 127 and at least one organic layer 129 are alternately stacked one above another, and may be formed via, for example, atomic layer deposition (ALD).

Although an upper substrate (not illustrated) may be further provided on the top of the barrier layer 130, the upper substrate may not be provided.

As mentioned above, the organic light-emitting diode display panel according to an embodiment of the present invention, formed as described above, may be realized as a foldable display, and may have the effect of reducing or preventing peeling of the organic layer 118 when folded.

As is apparent from the above description, according to an embodiment of the present invention, when a light-emitting diode display panel includes a reversed spacer, the adhesive force of an organic layer may be increased. As such, when a foldable panel is formed, the peeling of the organic layer in a folding area may be reduced or prevented.

In particular, an organic light-emitting diode display panel according to the first embodiment and the second embodiment of the present invention may reduce or prevent spreading of peeling of the organic layer, which occurs in all directions, regardless of the direction in which the peeling of the organic layer occurs.

The above description is merely given to describe the present invention by way of example, and numerous modifications and embodiments can be devised by those skilled in the art that will fall within the spirit and scope of the principles of this disclosure. Accordingly, the embodiments disclosed in the specification of the present invention are not intended to limit the present invention. The scope of the present invention should be construed by the following claims, and all technologies and the invention is to cover all modifications, equivalents, and alternatives falling within the spirit and scope of the invention as defined by the claims.

What is claimed is:

1. An organic light-emitting diode display comprising:
    a plurality of first electrodes on a substrate;
    a bank insulation layer on the substrate including the first electrodes, the bank insulation layer having openings to expose the first electrodes;
    a plurality of reversed spacers on the bank insulation layer and including a reversed-trapezoidal vertical cross-section, the reversed spacers having a bar shape or a dot shape when viewed from a direction perpendicular to the substrate;
    an organic layer including a light-emitting layer on the first electrodes exposed through the openings, on the bank insulation layer, and on a top of each reversed spacer; and
    a second electrode on a surface of the substrate including the bank insulation layer and the organic layer.

2. The panel according to claim 1, wherein the openings have a diamond shape, and the openings, which are adjacent to each other in a vertical direction, are arranged so as to be shifted from each other by a width of each opening, and
    wherein the reversed spacers are located between the openings, which are shifted from each other.

3. The panel according to claim 1, wherein the reversed spacers include a plurality of first reversed spacers each having at least one bent portion.

4. The panel according to claim 3, wherein the first reversed spacers are arranged at a constant interval in a horizontal direction, and are located between the diamond-shaped openings so as to form a zigzag shape in a vertical direction.

5. The panel according to claim 4, wherein the first reversed spacers are provided respectively with discontinuous areas, which are arranged at a constant interval in the vertical direction, and a current path of the second electrode is formed through the discontinuous areas.

6. The panel according to claim 5, wherein the first reversed spacers respectively include the discontinuous areas formed in the bent portions at a constant interval.

7. The panel according to claim 6, wherein the discontinuous areas are alternately arranged with continuous areas, at which the each discontinuous area is located so as to be shifted in the vertical direction from the discontinuous area of another first reversed spacer, which is adjacent thereto in the horizontal direction.

8. The panel according to claim 5, further comprising a second reversed spacer located in a portion of each discontinuous area, the second reversed spacer having a dot shape and including a reversed-trapezoidal cross section.

9. The panel according to claim 2, wherein the reversed spacers include:
    a plurality of third reversed spacers having a major axis oriented in a first diagonal direction; and
    a plurality of fourth reversed spacers arranged in a second diagonal direction so as to cross the third reversed spacers.

10. The panel according to claim 9, wherein each third reversed spacer or each fourth reversed spacer is discontinuously formed at an intersection at which the third and fourth reversed spacers cross each other.

11. The panel according to claim 10, wherein, when the third reversed spacer is discontinuously formed at the intersection, the fourth reversed spacer is discontinuously formed at another adjacent intersection, and
    wherein, when the fourth reversed spacer is discontinuously formed at the intersection, the third reversed spacer is discontinuously formed at another adjacent intersection.

* * * * *